United States Patent
Kim et al.

(10) Patent No.: US 9,964,829 B2
(45) Date of Patent: May 8, 2018

(54) TRANSPARENT DISPLAY APPARATUS

(71) Applicant: Electronics and Telecommunications Research Institute, Daejeon (KR)

(72) Inventors: Tae-Youb Kim, Daejeon (KR); Chil Seong Ah, Daejeon (KR); Seong-Mok Cho, Daejeon (KR); Hojun Ryu, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days. days.

(21) Appl. No.: 15/406,580

(22) Filed: Jan. 13, 2017

(65) Prior Publication Data

US 2017/0219900 A1 Aug. 3, 2017

(30) Foreign Application Priority Data

Jan. 29, 2016 (KR) ........................ 10-2016-0011122

(51) Int. Cl.
- *G02F 1/153* (2006.01)
- *G02F 1/157* (2006.01)
- *G02F 1/155* (2006.01)
- *H01L 27/32* (2006.01)

(52) U.S. Cl.
CPC ............ *G02F 1/157* (2013.01); *G02F 1/155* (2013.01); *H01L 27/3232* (2013.01); *H01L 27/3246* (2013.01); *G02F 2201/44* (2013.01)

(58) Field of Classification Search
CPC ....... G02F 1/157; G02F 1/155; G02F 2201/44
USPC ................ 359/275, 265, 245, 240, 238, 237
See application file for complete search history.

(56) References Cited

U.S. PATENT DOCUMENTS

| 7,557,499 B2 * | 7/2009 | Reynolds ................ G02F 1/155 313/503 |
| 8,901,548 B2 | 12/2014 | Ahn et al. |
| 9,299,758 B2 | 3/2016 | Park et al. |
| 2016/0225832 A1 * | 8/2016 | Kwon ................ G02F 1/133555 |

FOREIGN PATENT DOCUMENTS

| JP | 4176400 B2 | 8/2008 |
| KR | 10-2015-0028128 A | 3/2015 |

OTHER PUBLICATIONS

Tae-Youb Kim et al., "Driving mechanism of high speed electrochromic devices by using patterned array", Solar Energy Materials & Solar Cells, Oct. 9, 2015, pp. 76-82, vol. 145, Elsevier.

* cited by examiner

*Primary Examiner* — Tuyen Tra (57) ABSTRACT

Provided is a transparent display apparatus including a lower panel on which a shutter region and a light emitting region are horizontally disposed, an upper panel including a recessed region configured to cover the shutter region and the light emitting region to face the lower panel, a light emitting device, and a shutter device. The shutter device includes a lower electrode and an electrochromic material layer that are sequentially laminated in the shutter region of the lower panel, an upper electrode disposed in the recessed region of the upper panel, and an electrolyte layer filled between the electrochromic material layer and the upper electrode.

12 Claims, 6 Drawing Sheets

//TRANSPARENT DISPLAY APPARATUS

CROSS-REFERENCE TO RELATED APPLICATIONS

This U.S. non-provisional patent application claims priority under 35 U.S.C. § 119 of Korean Patent Application No. 10-2016-0011122, filed on Jan. 29, 2016, the entire contents of which are hereby incorporated by reference.

BACKGROUND

The present disclosure herein relates to a transparent display apparatus, and more particularly, to a transparent display apparatus including an organic light emitting diode.

In recent years, a demand for a display device that has excellent emission efficiency, luminance, and viewing angle and fast response speed has been increasing. A liquid crystal display device of flat display devices requires a backlight as a separate light source and has a technical limitation in brightness, contrast rate, and viewing angle.

Accordingly, a display device, which may emit light itself not to require an additional light source and have relatively excellent brightness, contrast range, and viewing angle, has been increasingly interested. Thus, a transparent display device, which allows light to pass through front and rear surfaces thereof not to prevent one's view and simultaneously displays an image, has been actively developing. The transparent display device includes an emission type display device and a reflective display device. The emission type display device is composed of a shutter region and an emitting region. The reflective display device is only composed of a shutter region. For example, the transparent display apparatus is applied to a large TV, advertising screens, home appliances, monitors, small smart devices (e.g. phone and watch), electron guns and electronic shelf labels.

For example, an organic thin film of an organic light emitting diode is transparent in a visible ray region due to difference between absorption spectrum and light emitting spectrum, and an indium tin oxide (ITO) used for an anode electrode is also transparent in the visible ray region. Thus, when a cathode electrode of the organic light emitting diode is made of a transparent material, the transparent organic light emitting display device may be manufactured.

When the organic light emitting diode emits light to display an image, if the light incident into a rear surface is transmitted to a front surface, the contrast rate may decrease to degrade a display quality. Also, since a transparent region does not block the incident light, a black screen may not be displayed.

SUMMARY

The present disclosure provides a transparent display apparatus that has a variable transmittance.

The object of the present disclosure is not limited to the aforesaid, but other objects not described herein will be clearly understood by those skilled in the art from descriptions below.

An embodiment of the inventive concept provides a transparent display apparatus including a lower panel on which a shutter region and a light emitting region are horizontally disposed, an upper panel including a recessed region covering the shutter region and the light emitting region to face the lower panel, a light emitting device disposed in the light emitting region, and a shutter device disposed in the shutter region. The shutter device includes a lower electrode and an electrochromic material layer that are sequentially laminated in the shutter region of the lower panel, an upper electrode disposed in the recessed region of the upper panel, and an electrolyte layer filled between the electrochromic material layer and the upper electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

The objects, other objectives, features, and advantages of the present disclosure will be understood without difficulties through preferred embodiments below related to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

In the specification, it will be understood that when a component is referred to as being 'on' another component, it can be directly on the other component, or an intervening component may also be present. Also, in the figures, the dimensions of components are exaggerated for clarity of illustration.

The embodiment in the detailed description will be described with sectional views and/or plan views as ideal exemplary views of the present disclosure. In the figures, the dimensions of layers and regions are exaggerated for clarity of illustration. Accordingly, shapes of the exemplary views may be modified according to manufacturing techniques and/or allowable errors. Therefore, the embodiments of the present disclosure are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties and are used to illustrate a specific shape of a device region. Thus, this should not be construed as limited to the scope of the present disclosure. It will be understood that although the terms first and second are used herein to describe various elements, these elements should not be limited by these terms. These terms are only used to distinguish one component from another component. An embodiment described and exemplified herein includes a complementary embodiment thereof.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described in detail with reference to the accompanying drawings.

Figure 1:
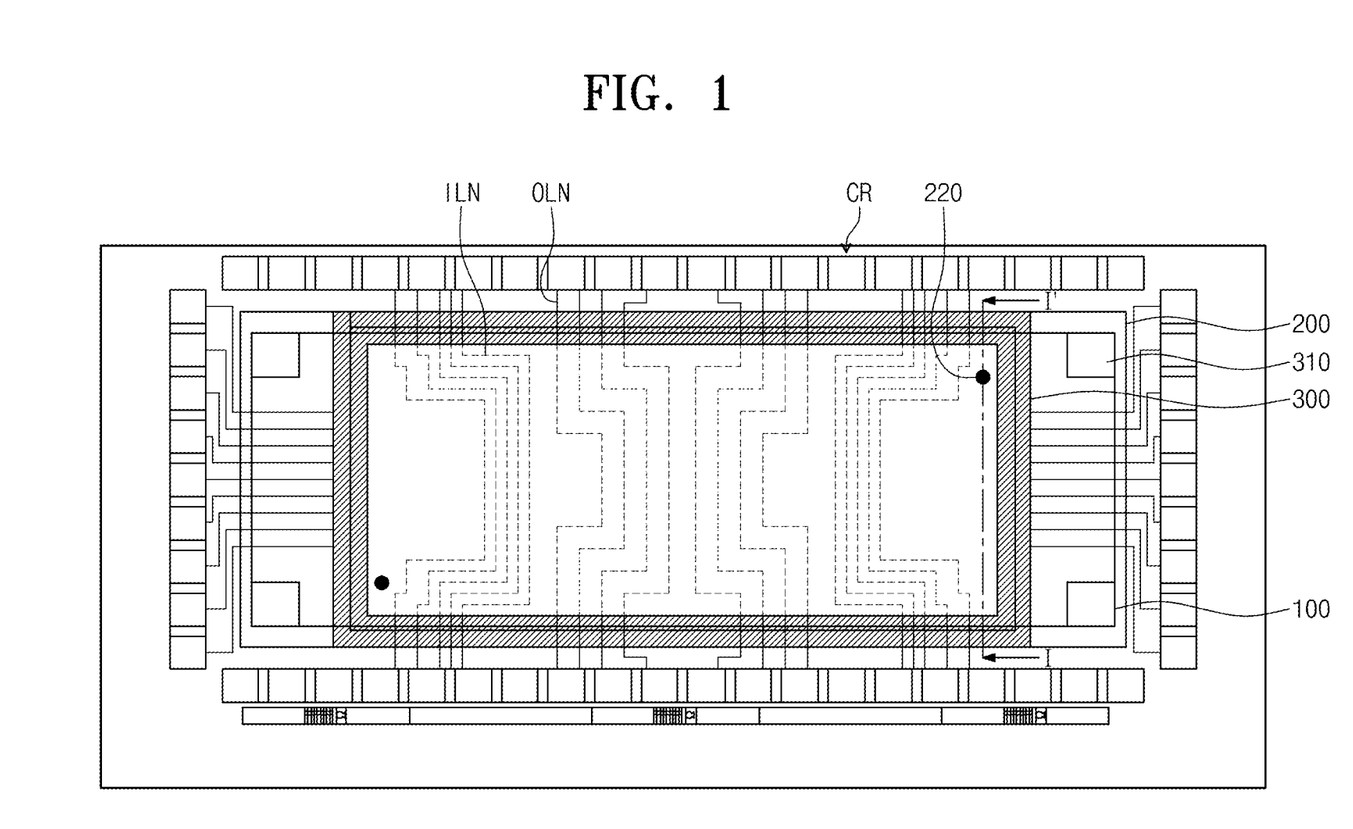
FIG. 1 is a plan view of a transparent display apparatus according to embodiments of the inventive concept.
Figure 2A:
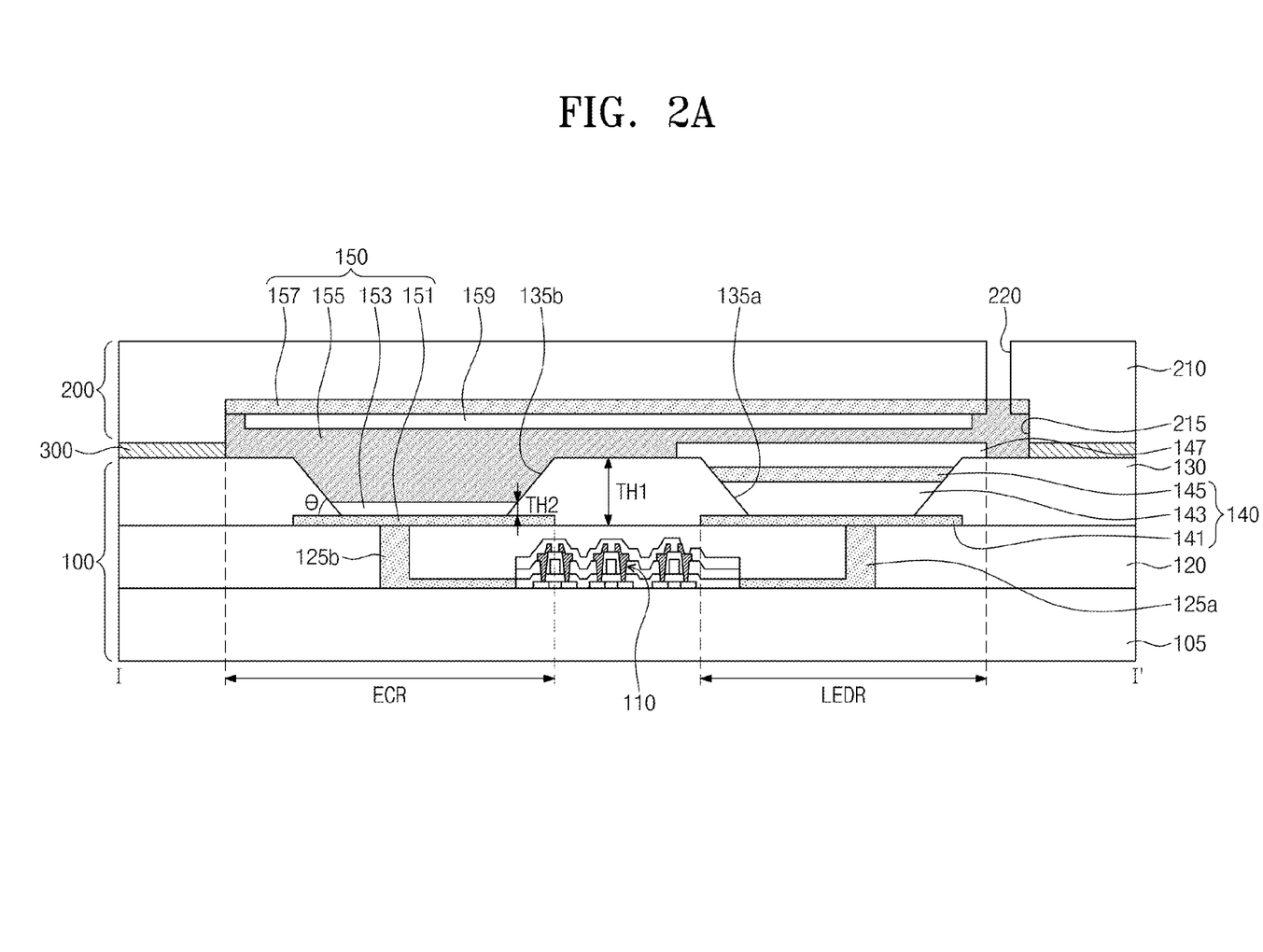
FIGS. 2A and 2B are cross-sectional views for explaining the transparent display apparatus according to embodiments of the inventive concept.
Figure 2B:
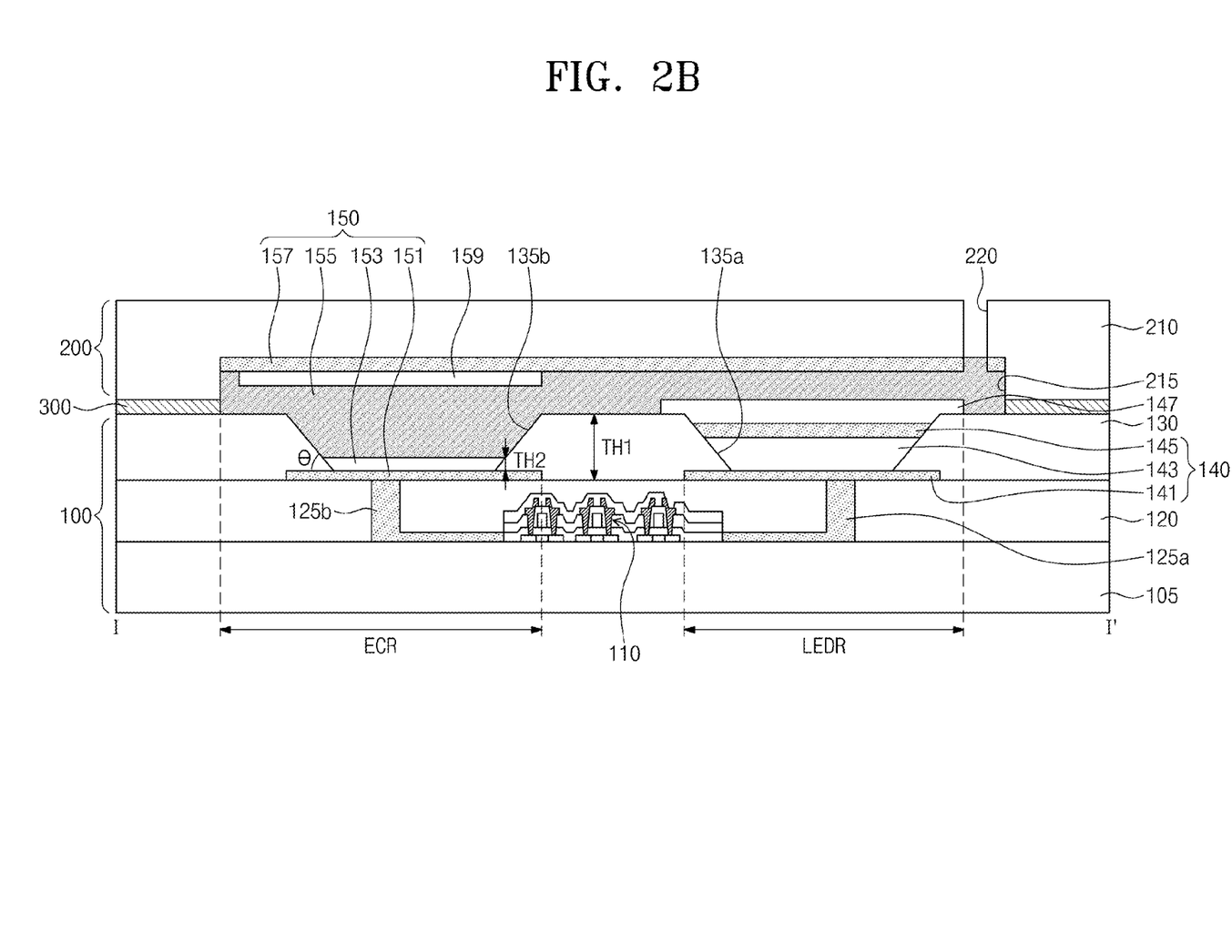

FIG. 1 is a plan view of a transparent display apparatus according to embodiments of the inventive concept, and FIGS. 2A and 2B are cross-sectional views for explaining the transparent display apparatus according to embodiments of the inventive concept. FIGS. 2A and 2B are cross-sectional views of the transparent display apparatus taken along line I-I' in FIG. 1.

Referring to FIGS. 1, 2A, and 2B, the transparent display apparatus may include display panels 100 and 200 and a circuit part CR for driving the display panels 100 and 200.

Connecting lines ILN and OLN for electrically connecting between the circuit part CR and the display panels 100 and 200 may be provided. The connecting lines ILN and OLN may include inner connecting lines ILN provided in the display panels 100 and 200 and outer connecting lines OLN provided outside the display panels 100 and 200. The inner connecting lines ILN may be transparent and include an indium tin oxide (ITO) that will be described later. The outer connecting lines OLN may include metal such as molybdenum (Mo). When the ITO is used for the overall connecting lines ILN and OLN, since a sheet resistance of the ITO may affect to electric characteristics of the transparent display apparatus, a portion through which light passes is made of the ITO, and the rest portion thereof is made of metal to increase the electric characteristics.

The display panels 100 and 200 may include a plurality of pixels. Each of the plurality of pixels may include a light emitting region LEDR in which a light emitting device 140 for displaying an image is disposed and a shutter region ECR in which a shutter device 150 that is convertible between transparent and light shielding modes is disposed. According to an embodiment, at least one light emitting region LEDR and at least one shutter region ECR may be disposed in one pixel.

Sub-pixels (see reference symbols SUB1, SUB2, and SUB 3 in FIG. 3A) may be disposed in each of the light emitting regions LEDR. For example, each of the light emitting regions LEDR may include a red sub-pixel, a green sub-pixel, and a blue sub-pixel.

According to inputted image data, the light emitting device 140 disposed in each of the sub-pixels SUB1, SUB2, and SUB 3 may be allowed to emit light to display an image. For this, the light emitting devices 140 respectively emitting red, green, or blue light and a plurality of pixel circuits 110 for driving the organic light emitting diodes 140 are disposed in each of the sub-pixels SUB1, SUB2, and SUB 3.

The display panels 100 and 200 may include a lower panel 100 on which the light emitting device 140 and the shutter device 150 are disposed and an upper panel 200 disposed above the lower panel 100.

The lower panel 100 may include a lower substrate 105, the pixel circuits 110 disposed on the lower substrate 105, a flattening layer 120 covering the pixel circuits 110, a bank insulating layer 130 defining the light emitting region LEDR and the shutter region ECR, the light emitting device 140 disposed in the light emitting region LEDR, and the shutter device 150 disposed in the shutter region ECR.

The lower substrate 105 may include a transparent material such as glass. According to an embodiment, the transparency represents a light transmittance of about 85% or more in a visible ray region. The pixel circuits 110 may be disposed on the lower substrate 105. The pixel circuits 110 may include a driving thin film transistor, a switching thin film transistor, a capacitor, or the like. Voltage difference between a data voltage and a reference voltage is charged to a capacitor connected between a gate electrode and a source electrode of the driving thin film transistor. The driving thin film transistor is switched by using the charging voltage of the capacitor. The light emitting device 140 may emit light by data current inputted through the driving thin film transistor to display an image.

The flattening layer 120 may cover the pixel circuits 110 on the lower substrate 105, on which the pixel circuits 110 are disposed, to flatten an upper surface thereof. The upper surface of the flattening layer 120 may be greater in level than upper surfaces of the pixel circuits 110. The flattening layer 120 may include an insulating material such as an oxide, a nitride, or an oxynitride. A first via wiring 125a and a second via wiring 125b, which pass through the flattening layer 120 and respectively and electrically connect the pixel circuits 110 to the light emitting device 140 and the shutter device 150, may be provided.

The bank insulating layer 130 may be disposed on the flattening layer 120 and include substantially the same material as the flattening layer 120. For example, the bank insulating layer 130 may include an oxide, a nitride, or an oxynitride. According to an embodiment of the inventive concept, the bank insulating layer 130 may have a first thickness TH1 in a vertical direction from the upper surface of the flattening layer 120. The bank insulating layer 130 may include a first opening 135a and a second opening 135b, which pass therethrough. The first opening 135a corresponds to the light emitting region LEDR, and the second opening 135b corresponds to the shutter region ECR. For example, each of the first opening 135a and the second opening 135b may gradually decrease in width from an upper portion to a lower portion thereof.

The light emitting device 140 disposed in the light emitting region LEDR may include an organic light emitting diode. Each of the light emitting devices 140 may include a lower electrode 141, an organic light emitting layer 143, and an upper electrode 145. The lower electrode 141 may be disposed between the flattening layer 120 and the bank insulating layer 130 and have an upper surface that is exposed by the first opening 135a. The lower electrode 141 may include a transparent electrode such as an indium tin oxide (ITO). The lower electrode 141 may be electrically connected to the pixel circuits 110 through the first via wiring 125a. For example, the first via wiring 125a may have a L-shaped structure. The organic light emitting layer 143 may fill at least a portion of the first opening 135a on the lower electrode 141. For example, the organic light emitting layer 143 may not completely bury the first opening 135a and may fill a lower portion of the first opening 135a. The upper electrode 145 may fill at least a portion of the first opening 135a on the organic light emitting layer 143. For example, the upper electrode 145 may not completely bury the first opening 135a and may expose an upper portion of the first opening 135a. The upper electrode layer 145 may include a transparent electrode such as an ITO. The ITOs of the lower electrode 141 and the upper electrode 145 may serve as the inner connecting lines ILN in FIG. 1 and electrically and respectively connected to the outer connecting lines OLN.

A protection film 147 covering the light emitting device 140 may be further provided. The protection film 147 may include a transparent insulating material. For example, the protection film 147 may include an insulating material such as an oxide, a nitride, or an oxynitride. The protection film 147 may completely bury the first opening 135a on the upper electrode. For example, the protection film 147 may completely bury the first opening 135a and cover at least a portion of an upper surface of the bank insulating layer 130. In this case, an upper surface of the protection film 147 may be greater in level than the upper surface of the bank insulating layer 130. For another example, when the protection film 147 only buries the first opening 135a, the upper surface of the protection film 147 may be the same level as the upper surface of the bank insulating layer 130.

The shutter device 150 disposed in the shutter region ECR may include one of an electrophoretic device, an electrowetting device, an electrochromic device, and an electro fluidic display (EFD). In an embodiment, the electrochromic device will be described as an example. The shutter device 150 may selectively transmit or not transmit light by an electrochromic material depending on whether a voltage is applied to the electrodes or not.

The shutter device 150 may include a lower electrode 151, an electrochromic material layer 153, an electrolyte layer 155, and an upper electrode 157. The lower electrode 151 may be disposed between the flattening layer 120 and the bank insulating layer 130 and have an upper surface that is exposed by the second opening 135b. The lower electrode 151 may include a transparent electrode such as an ITO. The lower electrode 151 may be electrically connected to the pixel circuits 110 through the second via wiring 125b. For example, the second via wiring 125b may have a L-shaped structure. The ITO of the lower electrode 151 may serve as the connecting lines ILN in FIG. 1 and electrically and respectively connected to the outer connecting lines OLN.

The electrochromic material layer 153 may fill at least a portion of the second opening 135b on the lower electrode 151 of the shutter device 150. For example, the electrochromic material layer 153 may fill a lower portion of the second opening 135b. According to an embodiment, the electrochromic material layer 153 may have a second thickness TH2. Here, the first thickness TH1 may be four times to six times greater than the second thickness TH2. Also, according to an embodiment, a side surface of the second opening 135b has an angle θ more than 30 degree angle with respect to the upper surface of the lower electrode 151. As described above, when the bank insulating layer 130 has the enough thickness, and when the side surface of the second opening 135b has the enough angle with respect to the upper surface of the lower electrode 151, an additional partition between the light emitting device 140 and the shutter device 150 may be unnecessary. Also, since the bank insulating layer 130 is disposed between the light emitting device 140 and the shutter device 150, interference between the devices may be prevented.

The electrochromic material layer 153 may include an inorganic electrochromic material and an organic electrochromic material. For example, the inorganic electrochromic material may include at least one of $WO_3$, $NiO_xH_y$, $Nb_2O_5$, $TiO_2$, and $MoO_3$, and the organic electrochromic material may include at least one of viologen, phenothiazine, polyaniline, and triphenylamine. The electrolyte layer 155 may completely bury the second opening 135b on the electrochromic material layer 153. According to an embodiment, the electrolyte layer 155 may extend from the shutter region ECR to the light emitting region LEDR. Although the electrolyte layer 155 extends up to the light emitting region LEDR, the light emitting device 140 may be electrically separated from the shutter device 150 by the protection film covering the light emitting device 140. Also, the electrolyte layer 155 may have an upper surface that is greater in level than an upper surface of the lower panel 100. Description for this will be described later. The electrolyte may include a liquid electrolyte or a solid polymer electrolyte. For example, the liquid electrolyte may include a LiOH solution, a $LiClO_4$ solution, and a KOH solution, the inorganic-based hydrate may include $Ta_2O_5 \cdot 3.92H_2O$, and $Sb_2O_5 \cdot 4H_2O$, and the solid polymer electrolyte may include Poly-AMPS, Poly(VAP), and Modified $PEO/LiCF_3SO_3$. The upper electrode 157 of the shutter device 150 will be described later.

The upper panel 200 may include an upper substrate 210. The upper substrate 210 may include a transparent material such as glass. The upper substrate 210 may include a lower surface facing the lower panel 100 and an upper surface corresponding to the lower surface. According to an embodiment, the upper substrate 210 may include a recessed region 215 on the lower surface of the upper substrate 210. The recessed region 215 may cover the shutter region ECR and the light emitting region LEDR. The upper electrode 157 of the shutter device 150 may be disposed in the recessed region 215. The upper electrode 157 may extend from the shutter region ECR up to the light emitting region LEDR. The upper electrode layer 157 may include a transparent electrode such as an ITO. The ITO of the upper electrode 157 may serve as the inner connecting lines ILN in FIG. 1 and electrically and respectively connected to the outer connecting lines OLN.

An adhesion layer 300 for bonding the upper panel 200 to the lower panel 100 may be further provided. For example, each of the upper panel 200 and the lower panel 100 may have a rectangular shape in terms of a plane, and the upper panel 200 may be greater in size than the lower panel 100. The adhesion layer 300 may have a rectangular ring shape surrounding an area on which a plurality of pixels is disposed not to overlap the area. For example, the adhesion layer 300 may bond the bank insulating layer 130 of the lower panel 100 to the lower surface of the upper substrate 210. Here, the lower surface of the upper substrate 210 represents an outside the recessed region 215. For example, the adhesion layer 300 may include Surlyn®. The Surlyn® is a resin in which carboxylic random copolymer of ethylene and methacrylic acid is partially neutralized by metal such as zinc or sodium. The Surlyn® has excellent adhesion property and sealing property and is flexible even at a low temperature, sustainable to shock, and transparent.

When the lower panel 100 and the upper panel 200 are bonded to each other by the adhesion layer 300, a space between the electrochromic material layer 153 of the shutter device 150 and the upper electrode 157 of the shutter device 150 may be secured by the recessed region 215. The space may be filled with the electrolyte layer 155 of the shutter device 150. Thus, the electrolyte layer 155 of the shutter device 150 may be sufficiently filled by the recessed region 215 of the upper substrate 210.

Meanwhile, an injection hole 220 passing through the upper panel 200 and the upper electrode 157 of the shutter device 150 may be further provided. The injection hole 220 may be defined in one side of the recessed region 215 of the upper substrate 210. The electrolyte of the electrolyte layer 155 may be injected through the injection hole 220. As described above, when the electrolyte layer 155 includes the liquid electrolyte, the electrolyte may be easily injected into the space through the injection hole 220. When the electrolyte layer 155 includes the solid electrolyte, the electrolyte in a liquid state may be injected into the space through the injection hole 220, and then the electrolyte in a liquid state may be converted into the electrolyte in a solid state by using heat or ultraviolet rays. Accordingly, even when the electrolyte layer 155 includes the solid electrolyte, the electrolyte layer 155 may be easily formed.

As described above, as the upper electrode 157 of the shutter device 150 is disposed on the upper panel 200, the electrolyte layer 155 may secure a thickness and be more easily formed.

In the recessed region 215, an additional film 159 disposed between the upper electrode 157 of the shutter device 150 and the electrolyte layer 155 may be provided. According to an embodiment, the additional film 159 may serve as the additional electrochromic material layer 153 of the shutter device 150. In this case, the additional film 159 may include at least one of $WO_3$, $NiOxHy$, $Nb_2O_5$, $TiO_2$, MoO3, viologen, phenothiazine, and polyaniline. According to another embodiment, the additional film 159 may include an oxidant and a reductant Referring to FIG. 2A, the additional film 159 may extend from the shutter region ECR up to the light emitting region LEDR between the upper electrode 157 of the shutter device 150 and the electrolyte layer 155. Referring to FIG. 2B, the additional film 159 may selectively cover only the shutter region ECR.

Pads 310 electrically connecting the upper panel 200 to the lower panel 100 may be provided. The pads 310 may be disposed further outside than the adhesion layer 300. For example, the pads 310 may be disposed on edges of the lower panel 100. Although the four pads 310 are illustrated as an example, an embodiment of the inventive concept is not limited to the number of the pads 310.

As described above, as at least one shutter device 150 and at least one light emitting device 140 are disposed together in one pixel, the light emitting device 140 may display a color, and a transmittance of light may be adjusted by the shutter device 150 to perform gray scale modulation.

Also, a voltage applied to the shutter is adjusted on the basis of an amount of light to increase visual recognition of the transparent display apparatus including the shutter and the light emitting device 140. For example, the shutter may be converted to a light shielding mode when the amount of light is great, and the shutter may be converted to a light transmitting mode when the amount of light is small to increase the visual recognition of the transparent display apparatus.

FIGS. 3A to 3E are plan views for explaining pixels according to embodiments of the inventive concept.

Referring to FIGS. 3A to 3E, each of the pixels may include at least one light emitting region LEDR and at least one shutter region ECR. The light emitting region LEDR may include a plurality of sub-pixel areas SUB1, SUB2, and SUB3. Hereinafter, although the light emitting region LEDR includes three sub-pixels SUB1, SUB2, and SUB3, one light emitting region LEDR has a constant area, and the light emitting region LEDR has a rectangular shape having an aspect ratio of 1:1 in terms of a plane, an embodiment of the inventive concept is not limited thereto. Also, three light emitting devices (see reference numeral 140 in FIG. 2A) are disposed in the one light emitting region LEDR, and one shutter device (see reference numeral 150 in FIG. 2A) is disposed in the one shutter region ECR. According to embodiments, area ratios of the light emitting region LEDR and the shutter region ECR may be substantially the same as each other or different from each other.

Figure 3A:
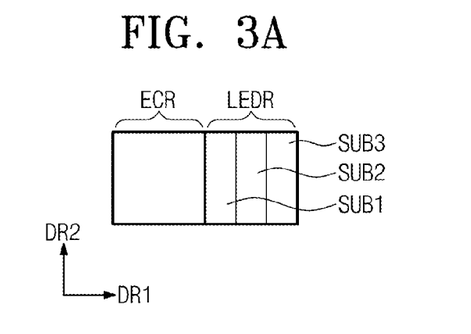
FIGS. 3A to 3E are plan views for explaining pixels according to embodiments of the inventive concept.

Referring to FIG. 3A, each of the pixels may include one light emitting region LEDR and one shutter region ECR. For example, the light emitting region LEDR and the shutter region ECR may be disposed horizontally to each other. In this case, one light emitting region LEDR and one shutter region ECR may have the area ratio of 1:1. The light emitting region LEDR may have a rectangular shape having an aspect ratio of 1:1 in terms of a plane.

Figure 3B:
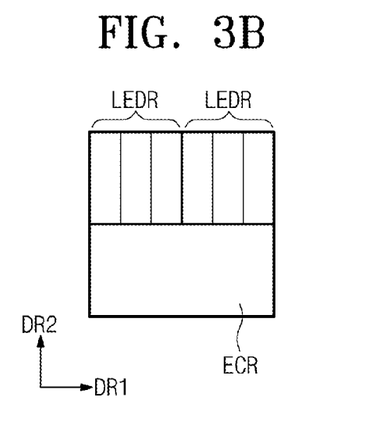

Referring to FIG. 3B, each of the pixels may include two light emitting regions LEDR and one shutter region ECR. In this case, one light emitting region LEDR and one shutter region ECR may have the area ratio of 1:2. For example, the two light emitting regions LEDR may be disposed in a first direction DR1 (e.g., a transverse direction), and the shutter region ECR may be disposed in a second direction DR2 (e.g., a longitudinal direction) that is perpendicular to the first direction DR1. The shutter region ECR may have the aspect ratio of 1:2. According to another embodiment, the shutter region ECR may be disposed with the two light emitting regions LEDR in the first direction DR1. Even in the case, the shutter region ECR may have the aspect ratio of 1:2.

Figure 3C:
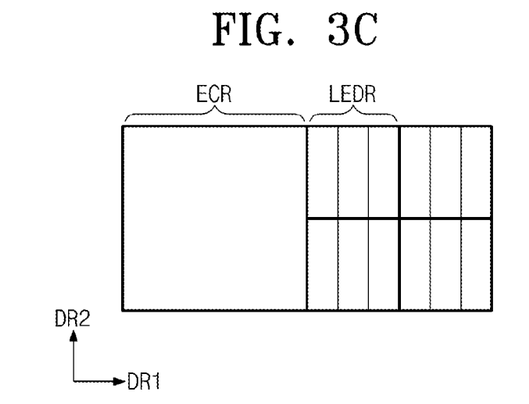

Referring to FIG. 3C, each of the pixels may include four light emitting regions LEDR and one shutter region ECR. In this case, one light emitting region LEDR and one shutter region ECR may have the area ratio of 1:4. For example, two light emitting regions LEDR may be disposed in the second direction DR2 perpendicular to the first direction DR1 to correspond to the rest two light emitting regions LEDR, which are adjacent to each other in the first direction DR1, of the four light emitting regions LEDR. The shutter region ECR may be disposed horizontally to the four light emitting regions LEDR in the first direction DR1. In the case, the shutter region ECR may have the aspect ratio of 1:1.

Figure 3D:
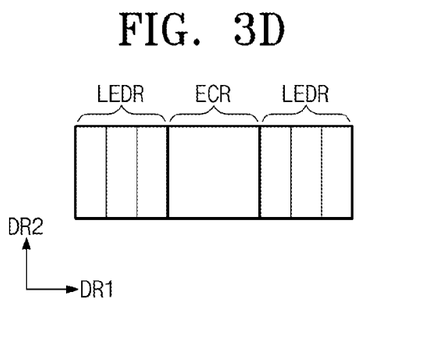
Figure 3E:
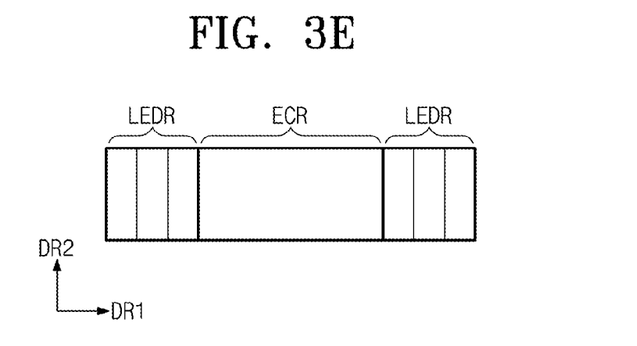

Referring to FIGS. 3D and 3E, each of the pixels may include two light emitting regions LEDR and one shutter region ECR disposed between the light emitting regions LEDR. In case of FIG. 3D, one light emitting region LEDR and one shutter region ECR may have the area ratio of 1:1. The shutter region ECR may have the aspect ratio of 1:1. In case of FIG. 3E, one light emitting region LEDR and one shutter region ECR may have the area ratio of 1:2. The shutter region ECR may have the aspect ratio of 1:2.

Although various structures of the pixels are described above, an embodiment of the inventive concept is not limited to the structures of the pixels.

Figure 4:
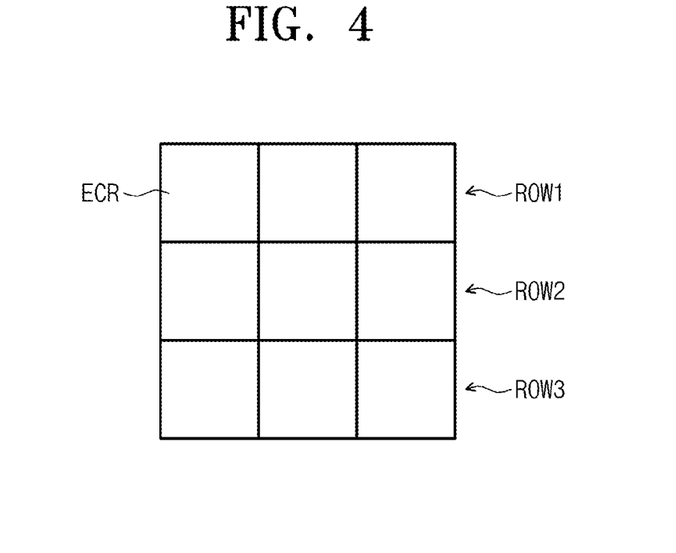
FIG. 4 is a plan view for explaining the pixel including shutter regions.
Figure 5:
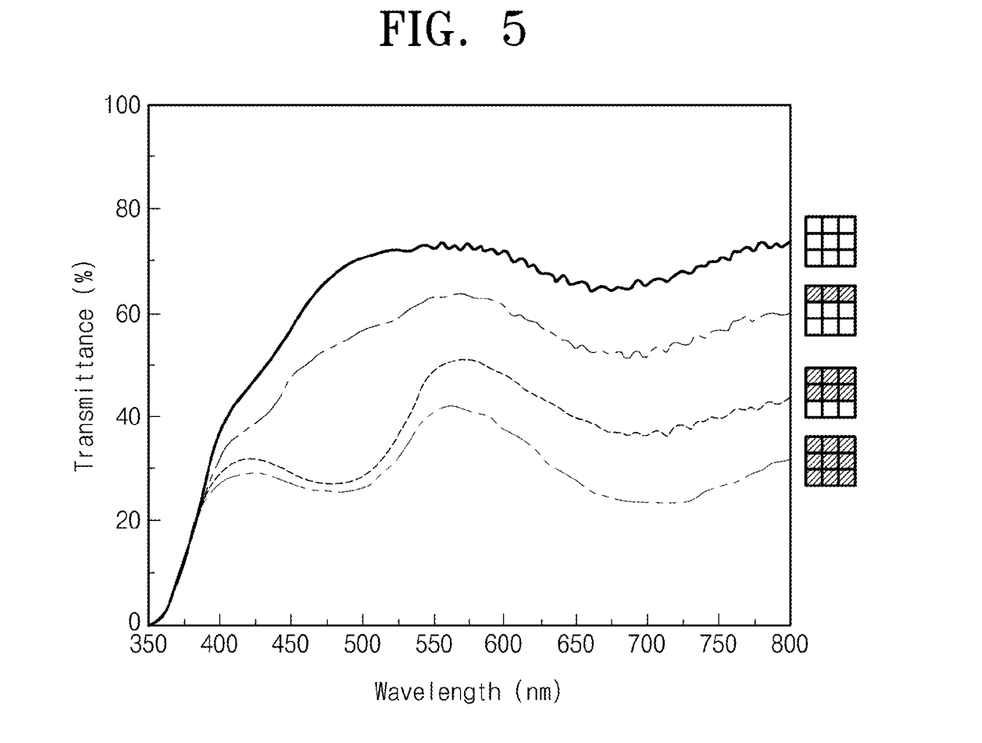
FIG. 5 is a graph showing a transmittance according to a wavelength of light that is incident into the pixel while a mode of the shutter regions in FIG. 4 is converted.

FIG. 4 is a plan view illustrating the pixel in which the shutter regions are provided, and FIG. 5 is a graph illustrating a transmittance according to a wavelength of light irradiated to the pixel.

Referring to FIG. 4, nine shutter regions ECR are disposed in one pixel. The shutter regions ECR may have a 3×3 arrangement, and each of the nine shutter regions ECR may be independently converted between the light shielding mode and the light transmitting mode. Hereinafter, three shutter regions ECR are arranged in a first row ROW1, a second row ROW2, and a third row ROW3.

Referring to FIG. 5, the transmittances according to the wavelength of the light irradiated to each of the pixels are shown in cases in which all of the nine shutter regions ECR in FIG. 4 are in the light transmitting mode, the three shutter regions ECR in the first row ROW1 are in the light shielding mode and the rest six shutter regions ECR in the first and second rows ROW1 and ROW2 are in the light shielding mode, the six shutter regions ECR in the first and second rows ROW1 and ROW2 are in the light shielding mode and the rest three shutter regions ECR are in the light transmitting mode, and all of the nine shutter regions ECR are in the light shielding mode, respectively.

Referring to FIG. 5, as the number of the shutter regions ECR in the light shielding mode increases, the transmittance decreases. In cases in which all of the nine shutter regions ECR are in the light transmitting mode and only the three shutter regions ECR are in the light shielding mode, the transmittance increases in the wavelength of about 350 nm to about 600 nm, decreases in the wavelength of about 600 nm to about 700 nm, and then increases in the wavelength that is greater than about 700 nm.

In cases in which the six shutter regions ECR are in the light shielding mode and all of the nine shutter regions ECR are in the light shielding mode, the transmittance increases in the wavelength of about 350 nm to about 400 nm, decreases in the wavelength of about 400 nm to about 500 nm, increases in the wavelength of about 500 nm to 570 nm, decreases up to the wavelength of about 730 nm, and then increases in the wavelength that is grater than about 730 nm.

Referring to FIG. 5, the driving of the light shielding mode and the light transmitting mode of the plurality of shutter regions ECR may be adjusted to adjust the transmittance according to the wavelength of the light irradiated to the pixel.

Figure 6:
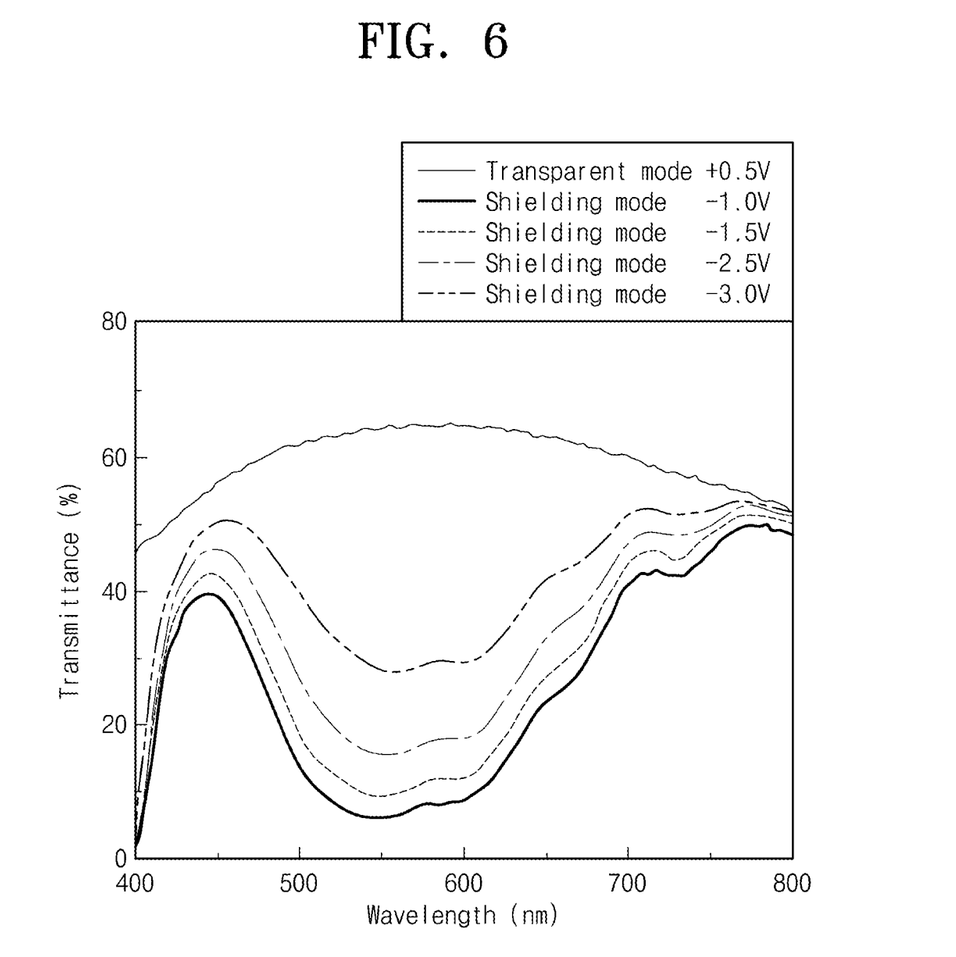
FIG. 6 is a graph showing the transmittance according to the wavelength of the light that is incident into the pixel while a voltage applied to the shutter regions changes.

FIG. 6 is a graph showing a variation of the transmittance according to the wavelengths of light irradiated to the pixels on the basis of voltages respectively applied to the pixels according to embodiments of the inventive concept.

Referring to FIG. 6, in case of the light transmitting mode, a voltage of about 0.5 V is applied to the shutter region of each of the pixels. In case of the light shielding mode, the transmittances when voltages of −1.0V, −1.5V, −2.5V, and −3.0V are respectively applied to the shutter regions of the pixels are shown. In case of the light shielding mode, the transmittances gradually decreases as the voltage applied to the shutter region goes in an order of −1.0V, −1.5V, −2.5V, and −3.0V.

Thus, the voltage applied in case of the light shielding mode of the plurality of shutter regions may be adjusted to adjust the transmittance according to the wavelength of the light irradiated to the pixel.

Referring to FIGS. 5 and 6, the driving of the light shielding or light transmitting mode in the shutter regions of the pixels and the voltage applied thereto may be adjusted to adjust the transmittance of a specific region of the pixels.

According to the embodiments of the inventive concept, as the upper electrode of the shutter device is disposed on the upper panel to secure the space into which the electrolyte layer is filled, the electrolyte layer may be easily injected to provide the electrolyte layer having the enough thickness.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Therefore, the embodiments described above include exemplary in all respects and not restrictive, but it should be understood.

What is claimed is:

1. A transparent display apparatus comprising:
   a lower panel on which a shutter region and a light emitting region are horizontally disposed;
   an upper panel comprising a recessed region configured to cover the shutter region and the light emitting region to face the lower panel;
   a light emitting device disposed in the light emitting region; and
   a shutter device disposed in the shutter region,
   wherein the shutter device comprises a lower electrode and an electrochromic material layer that are sequentially laminated in the shutter region of the lower panel, an upper electrode disposed in the recessed region of the upper panel, and an electrolyte layer filled between the electrochromic material layer and the upper electrode.

2. The transparent display apparatus of claim 1, wherein the lower panel comprises:
   a lower substrate;
   a plurality of circuits disposed on the lower substrate;
   a flattening layer configured to cover the circuits; and
   a bank insulating layer disposed on the flattening layer, the bank insulating layer comprising a first opening defining the shutter region and a second opening defining the light emitting region.

3. The transparent display apparatus of claim 2, wherein the lower electrode of the shutter device is disposed between the flattening layer and the bank insulating layer in the shutter region and has an upper surface that is exposed by the first opening, and
   the electrochromic material layer of the shutter device fills at least a portion of the first opening.

4. The transparent display apparatus of claim 2, wherein the light emitting device comprises:
   a lower electrode disposed between the flattening layer and the bank insulating layer in the light emitting region and has an upper surface that is exposed by the second opening; and
   a light emitting layer and an upper electrode that are sequentially laminated in the second opening on the lower electrode.

5. The transparent display apparatus of claim 4, wherein the light emitting device further comprises a protection film disposed between an upper electrode of the light emitting device and the electrolyte layer.

6. The transparent display apparatus of claim 2, wherein the bank insulating layer has a thickness that is about 4 times to about 6 times greater than that of the electrochromic material layer, and
   wherein a side surface of the first opening has an angle more than 30 degree angle with respect to an upper surface of the lower electrode.

7. The transparent display apparatus of claim 1, wherein the upper electrode of the shutter device covers the shutter region and the light emitting region within the recesses region.

8. The transparent display apparatus of claim 1, further comprising an additional film disposed between the upper electrode of the shutter device and the electrolyte layer.

9. The transparent display apparatus of claim 8, wherein the additional film covers the shutter region and the light emitting region.

10. The transparent display apparatus of claim 8, wherein the additional film covers the shutter region.

11. The transparent display apparatus of claim 8, wherein the additional film comprises an oxidant, a reductant, or an electrochromic material.

12. The transparent display apparatus of claim 1, wherein the upper panel further comprises an injection hole passing therethrough to expose the electrolyte layer.

* * * * *